United States Patent
Liou et al.

(10) Patent No.: US 10,203,596 B2
(45) Date of Patent: Feb. 12, 2019

(54) METHOD OF FILTERING OVERLAY DATA BY FIELD

(71) Applicant: UNITED MICROELECTRONICS CORP., Hsin-Chu (TW)

(72) Inventors: En-Chiuan Liou, Tainan (TW); Che-Yi Lin, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 598 days.

(21) Appl. No.: 14/989,765

(22) Filed: Jan. 6, 2016

(65) Prior Publication Data

US 2017/0193153 A1   Jul. 6, 2017

(51) Int. Cl.
    *G06F 17/50*   (2006.01)
    *G03F 1/36*    (2012.01)

(52) U.S. Cl.
    CPC ...................... *G03F 1/36* (2013.01)

(58) Field of Classification Search
    CPC .......................................................... G03F 1/36
    USPC ........................................................... 716/53
    See application file for complete search history.

(56) References Cited

U.S. PATENT DOCUMENTS

| | | | |
|---|---|---|---|
| 6,368,883 B1* | 4/2002 | Bode ................... | G03F 7/705 |
| | | | 257/E21.528 |
| 6,607,926 B1* | 8/2003 | Toprac ................ | G03F 7/70633 |
| | | | 257/E21.525 |
| 6,948,149 B2 | 9/2005 | Goodwin | |
| 7,598,006 B1* | 10/2009 | Smith ................. | G03F 7/70633 |
| | | | 430/22 |
| 9,123,583 B2 | 9/2015 | Lin | |
| 2004/0078724 A1* | 4/2004 | Keller ................ | G06F 17/5022 |
| | | | 714/48 |
| 2013/0147066 A1* | 6/2013 | Cheng ................ | G03F 7/70633 |
| | | | 257/797 |

\* cited by examiner

*Primary Examiner* — Jack Chiang
*Assistant Examiner* — Brandon Bowers
(74) *Attorney, Agent, or Firm* — Winston Hsu

(57) ABSTRACT

A method of filtering overlay data by field is provided in the present invention. The method includes the following steps. A minimum number of measure points per field on a semiconductor substrate is decided. Field data filtering rules are set. Overlay raw data is inputted. A raw data filtration is performed to the overlay raw data by field according to the field data filtering rules. Modified exposure parameters are generated for each field according to overlay data of remaining measure points per field after the raw data filtration when the number of the remaining measure points per field is larger than or equal to the minimum number of the measure points per field. Accordingly, the modified exposure parameters will be more effective in reducing the overlay error because more outliers may be filtered out before generating the modified exposure parameters.

12 Claims, 5 Drawing Sheets

METHOD OF FILTERING OVERLAY DATA BY FIELD

BACKGROUND OF THE INVENTION

1. Field of the Invention

The present invention relates to a method of filtering overlay data by field, and more particularly, to a method of filtering overlay data by field for generating modified exposure parameters.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The layout pattern has to be extremely accurate for forming delicate integrated circuits so as to align with the patterns of the previous and following steps.

The overlay errors between different patterned layers might occur for many reasons, such as the alignment accuracy of the exposure apparatus, wafer warpage, and influence from other manufacturing processes. The overlay errors have to be monitored for quality control and being used to modify the exposure parameters and/or find out the cause of the overlay error.

SUMMARY OF THE INVENTION

According to the claimed invention, a method of filtering overlay data by field is provided. The method includes the following steps. A minimum number of measure points per field on a semiconductor substrate is decided. Field data filtering rules are set. Overlay raw data is inputted. A raw data filtration is performed to the overlay raw data by field according to the field data filtering rules. Modified exposure parameters are generated for each field according to overlay data of remaining measure points per field after the raw data filtration when the number of the remaining measure points per field is larger than or equal to the minimum number of the measure points per field.

According to the method of filtering the overlay data by field in the present invention, the raw data filtration is performed to the overlay raw data by field according to the field data filtering rules, and the number of the remaining measure points per field has to be larger than or equal to the minimum number of the measure points per field before the step of generating the modified exposure parameters for each field according to the overlay data of the remaining measure points per field. The overlay data of the measure point with extreme overlay error will be filtered out by the field data filtering rules, and the modified exposure parameters will be more effective in reducing the overlay error accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
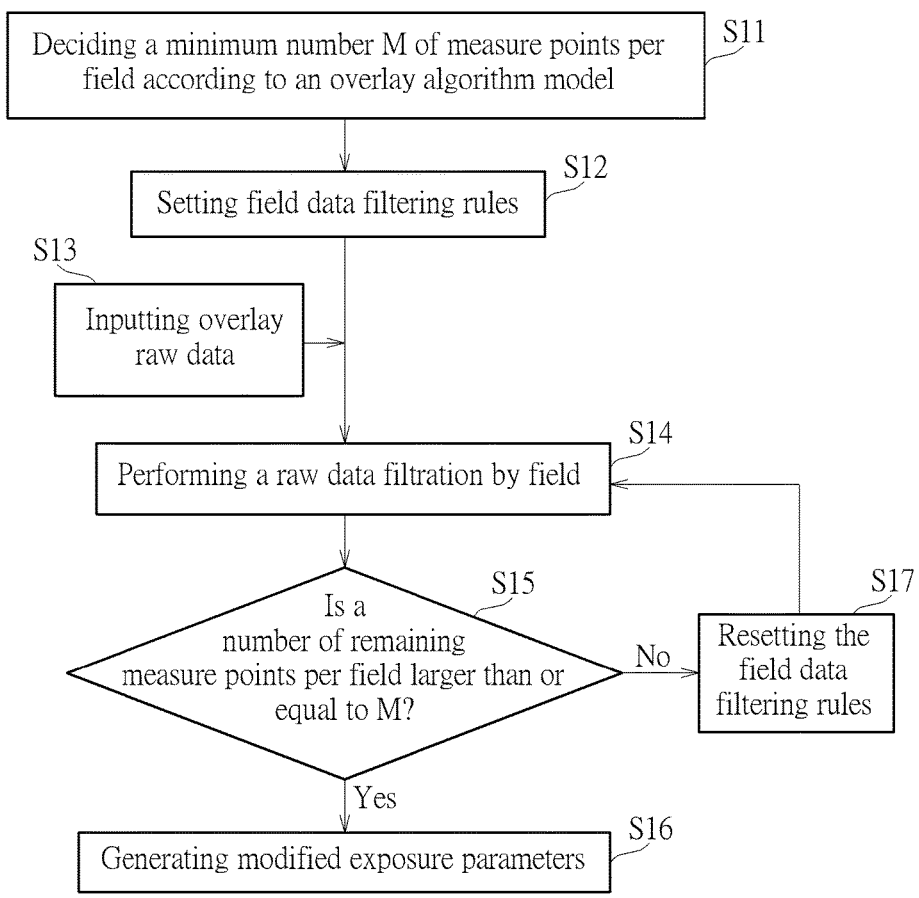
FIG. 1 is a flow chart illustrating a method of filtering overlay data by field according to a first embodiment of the present invention.
Figure 2:
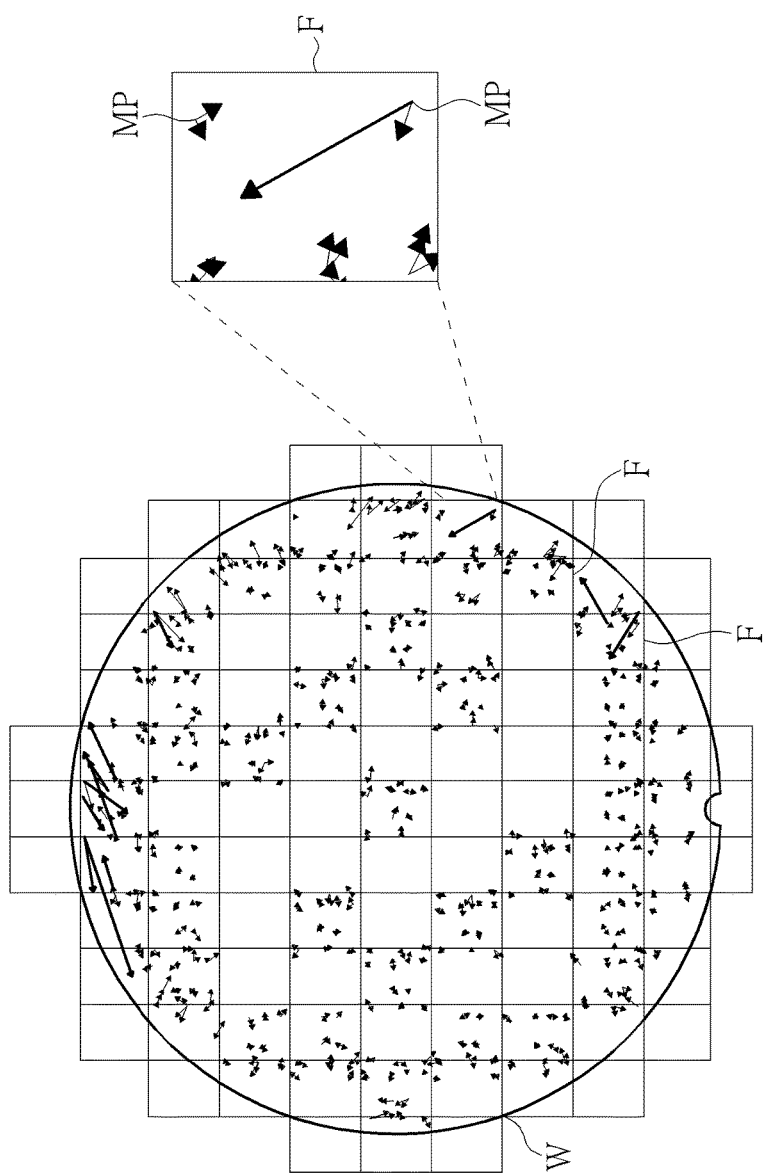
FIG. 2 is a schematic drawing illustrating a semiconductor substrate with fields, wherein overlay shifts are illustrated at some measure points.
Figure 3:
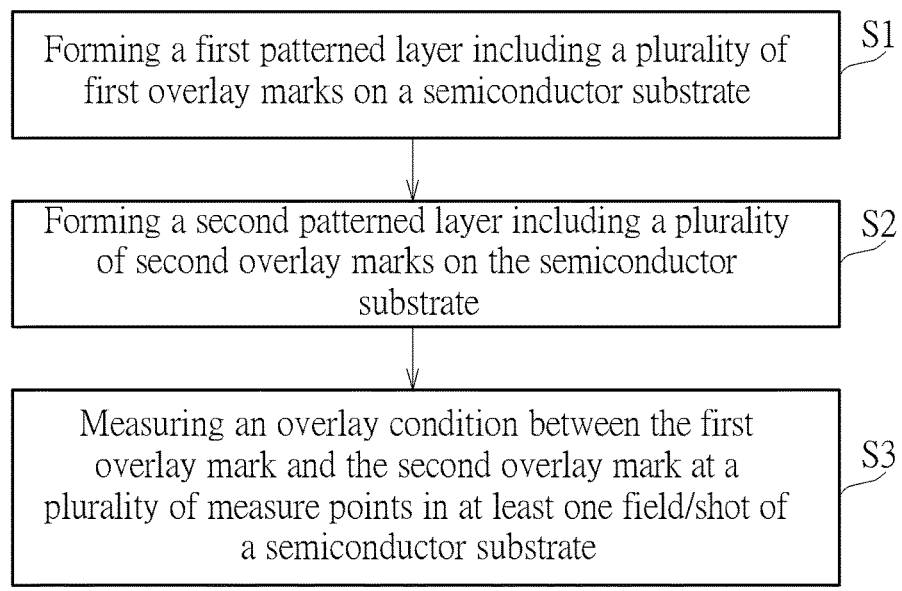
FIG. 3 is a flow chart illustrating a method of obtaining overlay raw data according to the first embodiment of the present invention.
Figure 4:
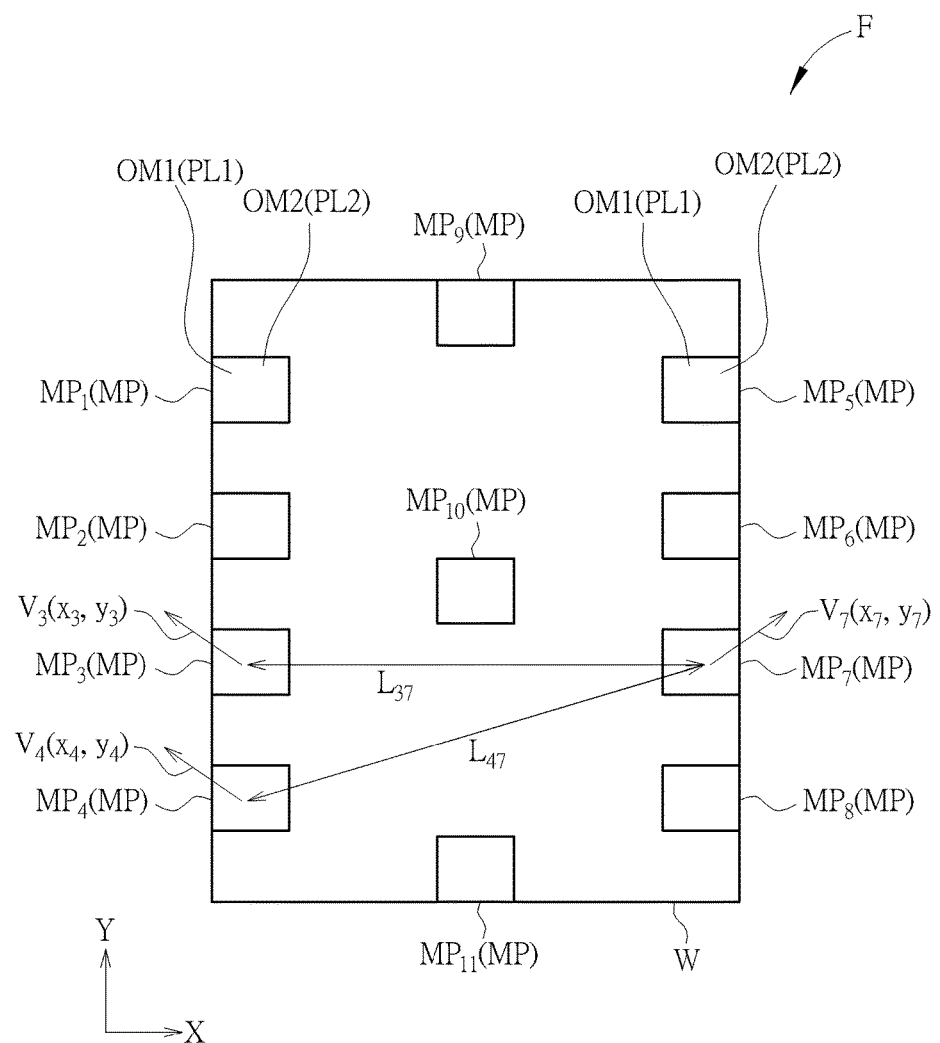
FIG. 4 is a schematic drawing illustrating distribution of measure points within a field.

Please refer to FIGS. 1-4. FIG. 1 is a flowchart illustrating a method of filtering overlay data by field according to a first embodiment of the present invention. FIG. 2 is a schematic drawing illustrating a semiconductor substrate with fields, wherein overlay shifts are illustrated at some measure points. FIG. 3 is a flowchart illustrating a method of obtaining overlay raw data in this embodiment. FIG. 4 is a schematic drawing illustrating distribution of measure points within a field. As shown in FIG. 1 and FIG. 2, the method of filtering overlay data by field in this embodiment includes the following steps. In step S11, a minimum number M of measure points MP per field F on a semiconductor substrate W is decided. In this embodiment, the semiconductor substrate W may be a wafer or other suitable semiconductor substrates, and the field F may be defined as an exposure field/shot on the semiconductor substrate W. There are a plurality of the fields F on the semiconductor substrate W, and each one of the field F is exposed by one shot of the exposure apparatus, such as a stepper exposure apparatus, a scanner exposure apparatus, or other appropriate exposure apparatus. As shown in FIG. 2 and FIG. 4, there are a plurality of measure points MP disposed at specific locations within each field F. The minimum number M of the measure points MP per field F on the semiconductor substrate W has to be predetermined according to an overlay algorithm model. The overlay algorithm model may include a single-order correction model, a high-order correction model, or other appropriate algorithm models. For example, the overlay algorithm model in this embodiment may be an intra-field high-order process correction (iHOPC) model, and the minimum number M of the measure points MP per field F may be 9, but not limited thereto.

In step S12, field data filtering rules are set. In step S13, overlay raw data is input. In step S14, a raw data filtration is performed to the overlay raw data by field according to the field data filtering rules. In the raw data filtration, one or more measure points MP having overlay values which do not match the field data filtering rules will be filtered out. In other words, the remaining measure points MP after the raw data filtration have overlay values matching the field data filtering rules. In this way, the overlay data of the measure point MP with extreme overlay error will be filtered out by the field data filtering rules before generating modified exposure parameters according to the overlay data. However, the number of the remaining measure points MP per field F after the raw data filtration has to be larger than or equal to the minimum number M of the measure points MP per field F, and the overlay algorithm model may then be used to generate modified exposure parameters for each field F according to the overlay data of the remaining measure points MP per field F. Otherwise, the overlay algorithm model cannot be operated with the number of the remaining measure points MP per field F less than the minimum number M. In other words, after the step of performing the raw data filtration by field, in step S15, the number of the remaining measure points MP per field F has to be checked if it is less than the minimum number M or not. If the number of the remaining measure points MP per field F is larger than or equal to the minimum number M of the measure points MP per field F, step S16 is performed to generate the modified exposure parameters for each field F according to the overlay data of the remaining measure points MP per field F. If the number of the remaining measure points MP per field F is less than the minimum number M of the measure points MP per field F, step S17 is performed instead so as to reset the field data filtering rules and perform the raw data filtration by field again according to the new field data filtering rules.

In this embodiment, the field data filtering rules may include filtering out one or more measure points MP having overlay values outside a filtering range, and the filtering range may be predetermined before the step of imputing the overlay raw data, but the present invention is not limited to this. In other embodiments of the present invention, the filtering range may be generated by calculating the statistical information of the overlay raw data per field, such as the data mean value, and/or the standard deviation, but not limited thereto. Additionally, the step of resetting the field data filtering rules may include enlarging the filtering range described above.

As shown in FIG. 3 and FIG. 4, the method of obtaining the overlay raw data may include the following steps. In step S1, a first patterned layer PL1 including a plurality of first overlay marks AM1 may be formed on the semiconductor substrate W first. In step S2, a second patterned layer PL2 including a plurality of second overlay marks AM2 may then be formed on the semiconductor substrate W. In this embodiment, the first patterned layer PL1 and the second patterned layer PL2 may include a patterned metal layer, a patterned dielectric layer, a patterned semiconductor layer, or a patterned photoresist respectively, but not limited thereto. Subsequently, step S3 is performed to measure an overlay condition between the first overlay mark AM1 and the second overlay mark AM2 at a plurality of measure points MP in at least one field/shot F of a semiconductor substrate W. The first overlay mark AM1 and the second overlay mark AM2 may include box-in-box overlay marks, bar-in-bar overlay marks, frame-in-frame overlay marks, or other suitable overlay marks. In this embodiment, the overlay value at each measure point MP may be a vector composed of a first axis deviation value in a first axis direction X and a second axis deviation value in a second axis direction Y. For example, there may be eleven measure points MP disposed within one field F on the semiconductor substrate W, the overlay value at a measure point MP may be a vector $V_i$ composed of a first axis deviation value $x_i$ and a second axis deviation value $y_i$, and wherein i may be 1, 2, 3, 4, 5, 6, 7, 8, 9, 10, or 11 in this embodiment. Accordingly, in the method of this embodiment, the modified exposure parameters may be applied to a photolithographic process of a next semiconductor substrate W or be applied to a rework photolithographic process of the semiconductor substrate W which the overlay raw data for modifying the exposure parameters is obtained therefrom.

In this embodiment, the field data filtering rules may be different according to many design considerations. For instance, the field data filtering rules may include filtering out one or more measure points MP when an absolute value of the first axis deviation value at this measure point is higher than or equal to a first threshold and/or an absolute value of the second axis deviation value at this measure point is higher than or equal to a second threshold. The first threshold and the second threshold may be predetermined independently according to design and process considerations. In other words, when the overlay value at the measure point MP does not match the condition (C1) listed below, the measure point MP will be filtered out by the raw data filtration by field. In the condition (C1), $x_i$ stands for the first axis deviation value at the measure point $MP_i$, $y_i$ stands for the second axis deviation value at the measure point $MP_i$, d1 stands for the first threshold, d2 stands for the second threshold, and wherein i may be 1, 2, 3, 4, 5, 6, 7, 8, 9, 10, or 11 in this embodiment.

$$|x_i|<d1 \text{ and/or } |y_i|<d2 \tag{C1}$$

Additionally, the field data filtering rules may also include filtering out one or more measure points MP when a root mean square value of the first axis deviation value and the second axis deviation value at this measure point MP is higher than or equal to a third threshold. In other words, when the overlay value at the measure point MP does not match the condition (C2) listed below, the measure point MP will be filtered out by the raw data filtration by field. In the condition (C2), d3 stands for the third threshold.

$$\sqrt{x_i^2+y_i^2}<d3 \tag{C2}$$

In addition, the field data filtering rules may also include filtering out one or more measure points MP when deviations per unit length between one measure point MP and other two measure points MP in the same field F are both higher than or equal to a fourth threshold. In other words, when the overlay value at the measure point $MP_i$ does not match the condition (C3) listed below, the measure point $MP_i$ will be filtered out by the raw data filtration by field. In the condition (C3), $x_i$ stands for the first axis deviation value at the measure point $MP_i$, and $y_i$ stands for the second axis deviation value at the measure point $MP_i$; $x_m$ stands for the first axis deviation value at the measure point $MP_m$, and $y_m$ stands for the second axis deviation value at the measure point $MP_m$; $x_n$ stands for the first axis deviation value at the measure point $MP_n$, and $y_n$ stands for the second axis deviation value at the measure point $MP_n$; $L_{im}$ stands for the distance between the measure point $MP_i$ and the $MP_m$, and $L_{in}$ stands for the distance between the measure point $MP_i$ and the $MP_n$; and d4 stands for the fourth threshold, wherein the measure point $MP_i$, the measure point $MP_m$ and the measure point $MP_n$ are different measure points within one field F.

$$\frac{\sqrt{(x_i-x_m)^2+(y_i-y_m)^2}}{L_{im}}<d4 \text{ and } \frac{\sqrt{(x_i-x_n)^2+(y_i-y_n)^2}}{L_{in}}<d4 \tag{C3}$$

For example, when the deviations per unit length between the measure point $MP_3$ and the measure point $MP_4$ is higher than or equal to the fourth threshold d4 and the deviations per unit length between the measure point $MP_3$ and the measure point $MP_7$ is higher than or equal to the fourth threshold d4 as shown in the condition (C4) listed below, the measure point $MP_3$ will be filtered out by the raw data filtration by field.

$$\frac{\sqrt{(x_3-x_4)^2+(y_3-y_4)^2}}{L_{34}} \geq d4 \text{ and } \frac{\sqrt{(x_3-x_7)^2+(y_3-y_7)^2}}{L_{37}} \geq d4 \tag{C4}$$

It is worth noting that the step of setting the field data filtering rules, the step of performing the raw data filtration by field, the step of checking the number of the remaining measure points per field after the raw data filtration by field, and/or the step of resetting the field data filtering rules mentioned above may be done by a computer. By applying the method of filtering the overlay data by field in this embodiment, the overlay data of the measure point MP with extreme overlay error will be filtered out by the field data filtering rules and the amount of the remaining measure points MP per field F is still sufficient for generating the modified exposure parameters. Accordingly, the modified exposure parameters will be more effective in reducing the overlay error because more outliers may be filtered out before generating the modified exposure parameters.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 5:
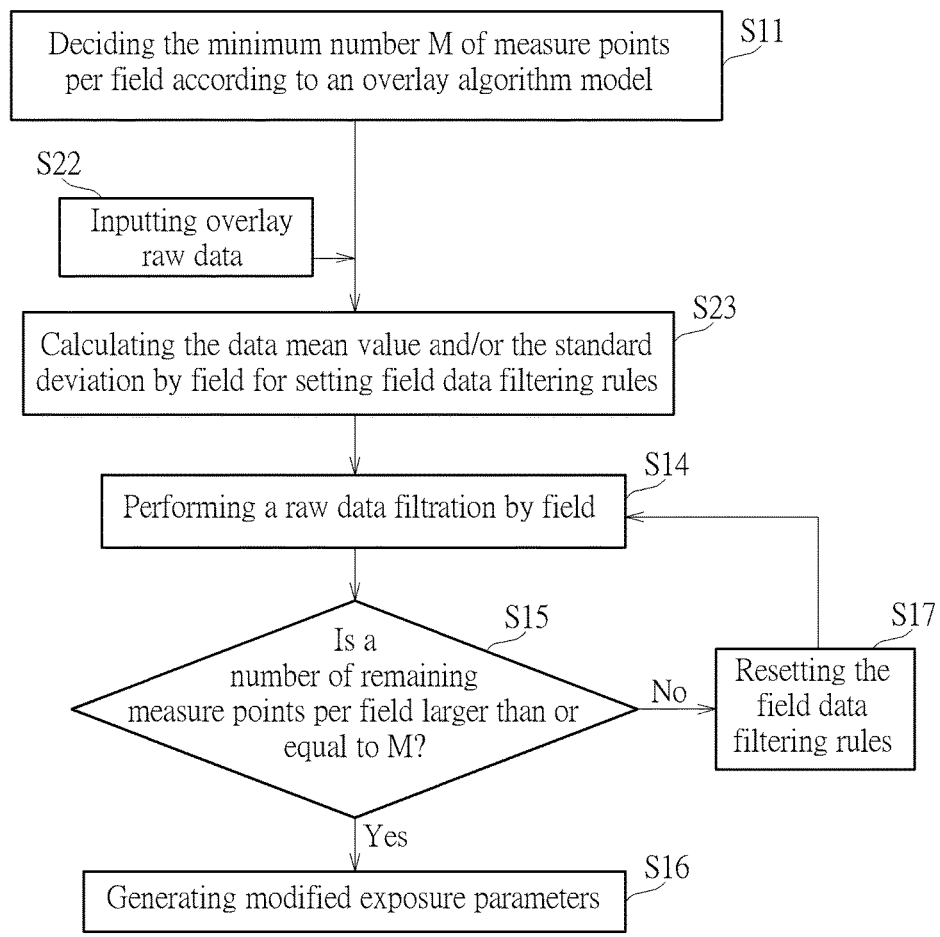
FIG. 5 is a flow chart illustrating a method of filtering overlay data according to a second embodiment of the present invention.

Please refer to FIG. 5. FIG. 5 is a flow chart illustrating a method of filtering overlay data according to a second embodiment of the present invention. As shown in FIG. 5, the difference between the method in this embodiment and the first embodiment mentioned above is that, after the step S11, step S22 is performed to input the overlay raw data. Subsequently, step S23 is performed before the step S14. In the step S23, the data mean value and/or the standard deviation of the overlay raw data by field is calculated for setting the field data filtering rules. In other words, the filtering range may be generated by calculating the statistical information of the overlay raw data per field, such as the data mean value, the standard deviation, or other suitable statistical information.

To summarize the above descriptions, in the method of filtering the overlay data by field in the present invention, the overlay data of the measure point with extreme overlay error will be filtered out by the field data filtering rules, and the modified exposure parameters will be more effective in reducing the overlay error because more outliers may be filtered out before generating the modified exposure parameters. The number of the remaining measure points per field after the raw data filtration by field has to be larger than or equal to the minimum number of the measure points per field according to the overlay algorithm model used to generate the modified exposure parameters, or the field data filtering rules have to be reset and the raw data filtration by field has to be performed again with the reset field data filtering rules.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of filtering overlay data by field, comprising:
deciding a minimum number of measure points per field on a semiconductor substrate;
setting field data filtering rules;
inputting overlay raw data, wherein the overlay raw data is obtained by measuring an overlay condition between a first overlay mark and a second overlay mark at a plurality of measure points in at least one field/shot of a semiconductor substrate;
performing a raw data filtration to the overlay raw data by field according to the field data filtering rules;
generating modified exposure parameters for each field according to overlay data of remaining measure points per field after the raw data filtration when the number of the remaining measure points per field is larger than the minimum number of the measure points per field, wherein the modified exposure parameters is applied to a photolithographic process of a next semiconductor substrate; and
exposing the next semiconductor substrate using the modified exposure parameters.

2. The method of claim 1, wherein the minimum number of the measure points per field is decided according to an overlay algorithm model.

3. The method of claim 2, wherein the overlay algorithm model comprises an intra-field high-order process correction (iHOPC) model.

4. The method of claim 1, wherein the field data filtering rules comprises filtering out one or more measure points having overlay values outside a filtering range.

5. The method of claim 4, wherein the filtering range is predetermined before the step of imputing the overlay raw data.

6. The method of claim 4, wherein the filtering range is generated by calculating the data mean value and/or the standard deviation of the overlay raw data by field.

7. The method of claim 1, further comprising:
resetting the field data filtering rules when the number of the remaining measure points per field is less than the minimum number of the measure points per field.

8. The method of claim 7, wherein the field data filtering rules comprises filtering out one or more measure points having overlay values outside a filtering range, and the step of resetting the field data filtering rules comprises enlarging the filtering range.

9. The method of claim 1, wherein the overlay raw data of each measure point comprises a first axis deviation value and a second axis deviation value.

10. The method of claim 9, wherein the field data filtering rules comprises filtering out one or more measure points when an absolute value of the first axis deviation value at this measure point is higher than or equal to a first threshold and/or an absolute value of the second axis deviation value at this measure point is higher than or equal to a second threshold.

11. The method of claim 9, wherein the field data filtering rules comprises filtering out one or more measure points when a root mean square value of the first axis deviation value and the second axis deviation value at this measure point is higher than or equal to a third threshold.

12. The method of claim 9, wherein the field data filtering rules comprises filtering out one or more measure points when deviations per unit length between one measure point and other two measure points in the same field are both higher than or equal to a fourth threshold.

* * * * *